United States Patent [19]

Nagaraj

[11] Patent Number: 5,550,510
[45] Date of Patent: Aug. 27, 1996

[54] CONSTANT TRANSCONDUCTANCE CMOS AMPLIFIER INPUT STAGE WITH RAIL-TO-RAIL INPUT COMMON MODE VOLTAGE RANGE

[75] Inventor: Krishnaswamy Nagaraj, Hillsborough Township, N.J.

[73] Assignee: Lucent Technologies Inc., Murray Hill, N.J.

[21] Appl. No.: 364,369

[22] Filed: Dec. 27, 1994

[51] Int. Cl.$^6$ .................................................. H03F 3/45
[52] U.S. Cl. .......................... 330/253; 330/258; 330/261
[58] Field of Search .................................... 330/253, 258, 330/261

[56] References Cited

U.S. PATENT DOCUMENTS

| | | | |
|---|---|---|---|
| 4,555,673 | 11/1985 | Huijsing | 330/258 |
| 4,887,048 | 12/1989 | Krenik et al. | 330/258 |
| 5,371,474 | 12/1994 | Wassenaar et al. | 330/261 X |
| 5,384,548 | 1/1995 | Sakurai et al. | 330/261 X |

OTHER PUBLICATIONS

Duque–Carrillo, J. F., et al., "Constant–Gm Rail–to–Rail Common–Mode Range Input Stage with Minimum CMRR Degradation," IEEE Journal of Solid–State Circuits, vol. 28, No. 6, Jun. 1993, pp. 661–666.

Fisher, J. A., and Koch, R., "A Highly Linear CMOS Buffer Amplifier," IEEE Journal of Solid–State Circuits, vol. SC–22, No. 3, Jun. 1987, pp. 330–334.

Pardoen, M. D., and Dergauwe, M. G. R., "A Rail–to–Rail Input/Output CMOS Power Amplifier," Proc. of the IEEE 1989 Custom Integrated Circuits Conference, San Diego, CA, May 15–18, 1989, pp. 25.5.1–25.5.4.

Wu, W–C. S., et al., "Digital–Compatible High–Performance Operational Amlifier with Rail–to–Rail Input and Output Ranges," IEEE Journal of Solid–State Circuits, vol. 29, No. 1, Jan. 1994, pp. 63–66.

*Primary Examiner*—James B. Mullins

[57] ABSTRACT

A differential amplifier having two complementary differential pairs connected for rail-to-rail common mode input voltage range operation including a constant transconductance maintaining bias circuit is disclosed. The bias circuit provides a fixed rail current bias to a master differential pair and adjusts the bias to the second pair in response to variations in the bias level of the master pair. A unique biasing method and method of operating a differential amplifier are also disclosed.

7 Claims, 3 Drawing Sheets

5,550,510

CONSTANT TRANSCONDUCTANCE CMOS AMPLIFIER INPUT STAGE WITH RAIL-TO-RAIL INPUT COMMON MODE VOLTAGE RANGE

FIELD OF THE INVENTION

The present invention relates generally to the field of differential amplifiers and more specifically to CMOS differential amplifiers intended to provide a rail-to-rail common mode input voltage range.

BACKGROUND OF THE INVENTION

CMOS amplifiers having the ability to accept common mode input voltages varying between the supply voltage rails are required in many applications, including input buffers and output drivers involving large signal swings.

An input circuit arrangement for providing a large common mode voltage input range employing a pair of complementary differential pairs is discussed in several articles: J. A. Fisher and R. Koch, "A highly linear CMOS buffer amplifier," IEEE Journal of Solid State Circuits, Vol. 22, pp. 330–334, June 1987; M. Pardoen and M. Degrauwe, "A rail-to-rail input/output CMOS power amplifier," Proc. Custom Integrated Circuits Conference, pp. 25.5.1–4, May 1989; J. F. Duque-Carillo, J. M. Valverde and R. Perez-Aloe, Constant $G_m$ rail-to-rail common mode input stage with minimum CMRR degradation, IEEE journal of Solid State Circuits, Vol. 28, pp. 661–666, June 1993; and W-C. Wu, W. J. Helms, J. A. Kuhn and B. E. Byrkett, "Digital-compatible high-performance operational amplifier with rail-to-rail input and output stages," IEEE Journal of Solid State Circuits, Vol. 29, pp. 63–66, January 1994. The output currents from the two pairs are summed together using current mirrors or can be directly injected into a folded cascode stage as discussed in J. A. Fisher and R. Koch, "A highly linear CMOS buffer amplifier," IEEE Journal of Solid State Circuits, Vol. 22, pp. 330–334, June 1987; and M. Pardoen and M. Degrauwe, "A rail-to-rail input/output CMOS power amplifier," Proc. Custom Integrated Circuits Conference, pp. 25.5.1–4, May 1989.

In the simplest form of this circuit, the tail current for each pair is held constant. Unfortunately, that arrangement leads to large variations in the net transconductance of the input stage as the common mode input voltage is varied. This large variation in net transconductance is undesirable because it leads to large variations in the unity gain frequency of the amplifier which makes optimal frequency compensation difficult to achieve especially in high frequency designs.

If the differential pairs are operated in the weak inversion region, i.e., barely turned on, the transconductance is approximately proportional to the tail current. Then the large variation in net transconductance can be avoided by fixing the sum of the tail currents. The drawback of the weak inversion approach, however, is that the drain current will be relatively low for a given transistor size which in turn adversely impacts other factors such as slew rate.

Even for transistors operated in moderate to strong inversion regions, fixing the sum of the tail currents to a constant value reduces the large variation in net transconductance by a factor of √2, Although a substantial improvement in reducing the variation of net transconductance results, a substantial variation is still present over the common mode input voltage range.

As a result there is a need for a differential amplifier having a constant net transconductance over the entire common mode input voltage range.

SUMMARY OF THE INVENTION

An amplifier in accordance with one aspect of the present invention includes a differential amplifier arrangement allowing a rail-to-rail common mode input voltage range and a bias circuit connected to bias the amplifier at the desired operating point. The bias circuit manipulates the bias point of one amplifier section in response to variations in the bias level of a second amplifier section thereby maintaining a substantially constant net transconductance in the amplifier.

A method of operating an amplifier in accordance with another aspect of the present invention includes the steps of setting a first bias level for one amplifier section, setting a reference bias level representative of a predetermined amplifier operating point, setting the bias level for a second amplifier section according to a predetermined relationship between the reference bias level and the first bias level, and adjusting the second bias level in response to variations in the first bias level thereby maintaining a constant net transconductance for the amplifier.

A bias circuit for maintaining constant net transconductance in an amplifier in accordance with yet another aspect of the present invention includes a first fixed source for providing a first bias, a second source having a control input connected to monitor the level of the first bias, the second source providing a second bias dependent on the first bias level according to a predetermined relationship and responsive to variation in the first bias level to adjust the second bias level to maintain a substantially constant net transconductance in the amplifier.

Other features and advantages of the present invention will become readily apparent to those of ordinary skill in the art by reference to the following detailed description and accompanying drawings.

BRIEF DESCRIPTION OF THE DRAWINGS

A better understanding of the invention may be had from a consideration of the following Detailed Description, taken in conjunction with the accompanying drawings in which.

DETAILED DESCRIPTION

Figure 1:
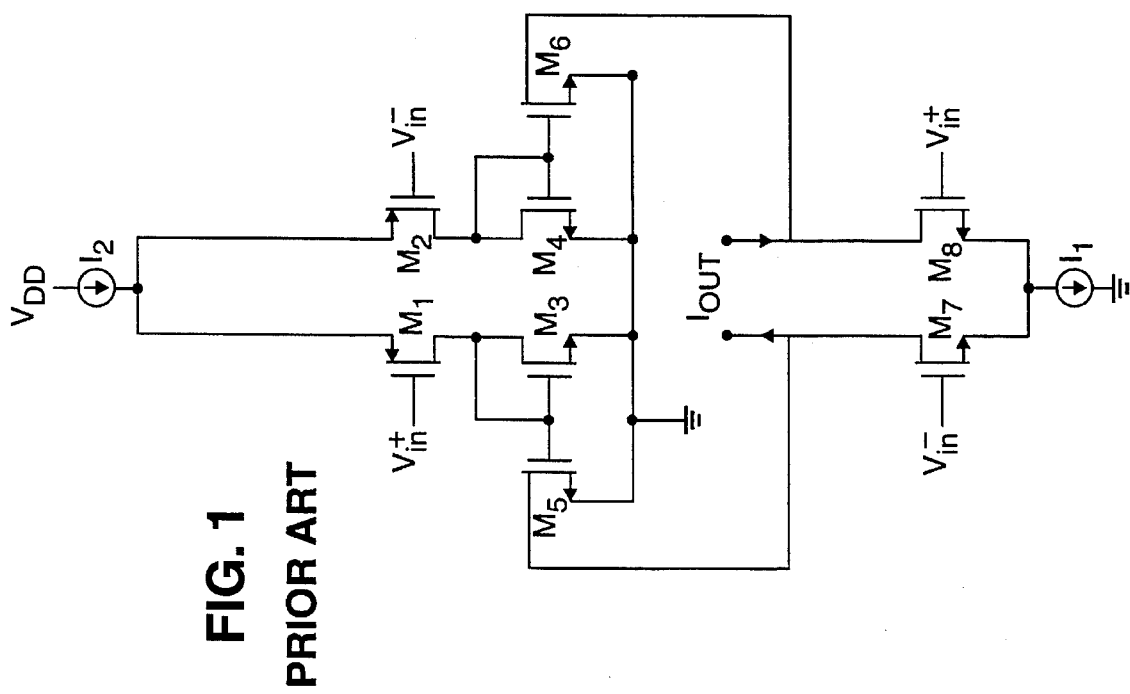
FIG. 1 is a schematic diagram of an amplifier input stage having a rail-to-rail common mode input voltage range using a pair of complementary differential pairs.

The present invention is best understood by comparison with the prior art. As a result, this detailed description begins with a discussion of a prior art amplifier input stage shown in FIG. 1. As discussed above, that circuit arrangement leads to large variations in net transconductance over the common mode input voltage range. Referring to FIG. 1, the net transconductance of the input stage for common mode input voltages between but not close to either of the positive and negative supply rails is given by the following equation:

$$g_m = K_1\sqrt{I_1} + K_2\sqrt{I_2} \quad [1]$$

Transistors $M_1$, $M_2$ are scaled (approximately 2.5 to 1) versions of transistors $M_7$, $M_8$ to make $K_1$ and $K_2$ equal. Equation [1] then simplifies to:

$$g_m = K(\sqrt{I_1} + \sqrt{I_2}) \quad [2]$$

Tail currents $I_1$, $I_2$ are typically set equal to each other and remain so for values of common mode input voltage between and not too close to either of the supply rails, $V_{DD}$ and ground. However, as the common mode input voltage ($V_{i_{cm}}$) approaches the positive supply rail $V_{DD}$, the tail current $I_2$ in the p-channel complementary differential pair $M_1$, $M_2$ approaches zero. Similarly, as the common mode input voltage approaches the negative supply rail (ground), tail current $I_1$ in the n-channel complementary differential pair $M_7$, $M_8$ approaches zero. An inspection of equation [2] above reveals that the first or second term drops out as the common mode input voltage approaches $V_{DD}$ or ground, respectively. The net transconductance in each case is then given by equations [3] and [4] respectively:

$$g_m = K\sqrt{I_2} \quad \text{for } V_{i_{cm}} \doteq 0 \quad [3]$$

$$g_m = K\sqrt{I_1} \quad \text{for } V_{i_{cm}} \doteq V_{DD} \quad [4]$$

Figure 2:
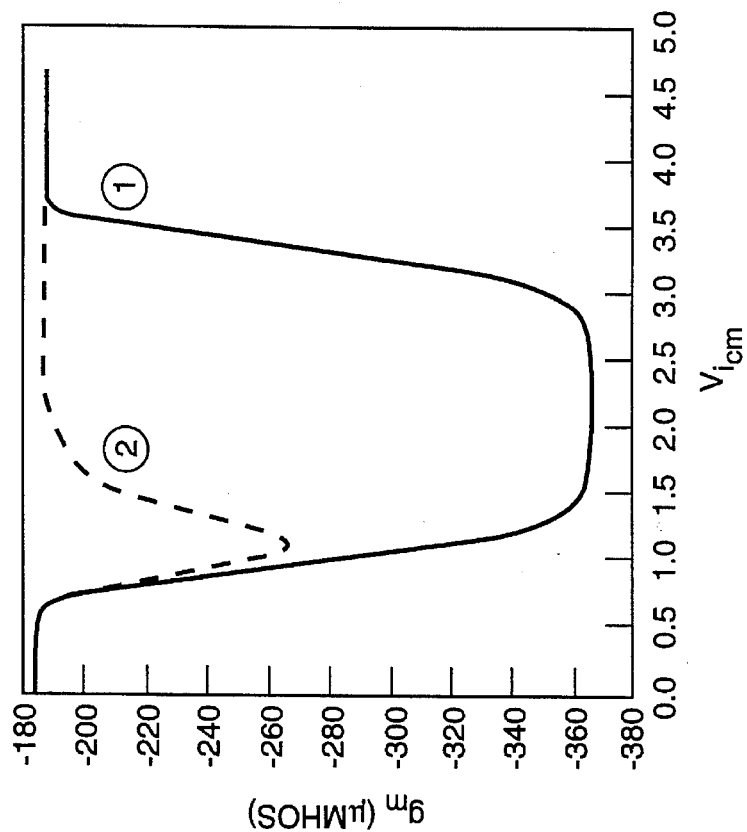
FIG. 2 is a plot of a simulation of the net transconductance versus common mode input voltage for an amplifier input stage shown in FIG. 1 and for a modified input stage.

Comparing equation [2] with either equation [3] or [4] reveals that the net transconductance of the input stage varies by a factor of two for large variations in the common mode input voltage. Referring to FIG. 2, a plot of the simulated variation of net transconductance of the input stage as a function of common mode input voltage is shown. The simulation was based on 0.9 micron CMOS technology and the device sizes have been chosen to match the transconductance of the pairs for a given tail current. The solid curve 1, shows the net transconductance variation for the input circuit of FIG. 1 which maintains each tail current $I_1$, $I_2$ constant. The dashed curve 2, shows the net transconductance variation for an input stage having a pair of complementary differential pairs with the sum of the tail currents held constant. A comparison of curve 2 with curve 1 of FIG. 2 shows that some improvement in reducing the variations in net transconductance is achieved by fixing the sum of the tail currents.

Figure 3:
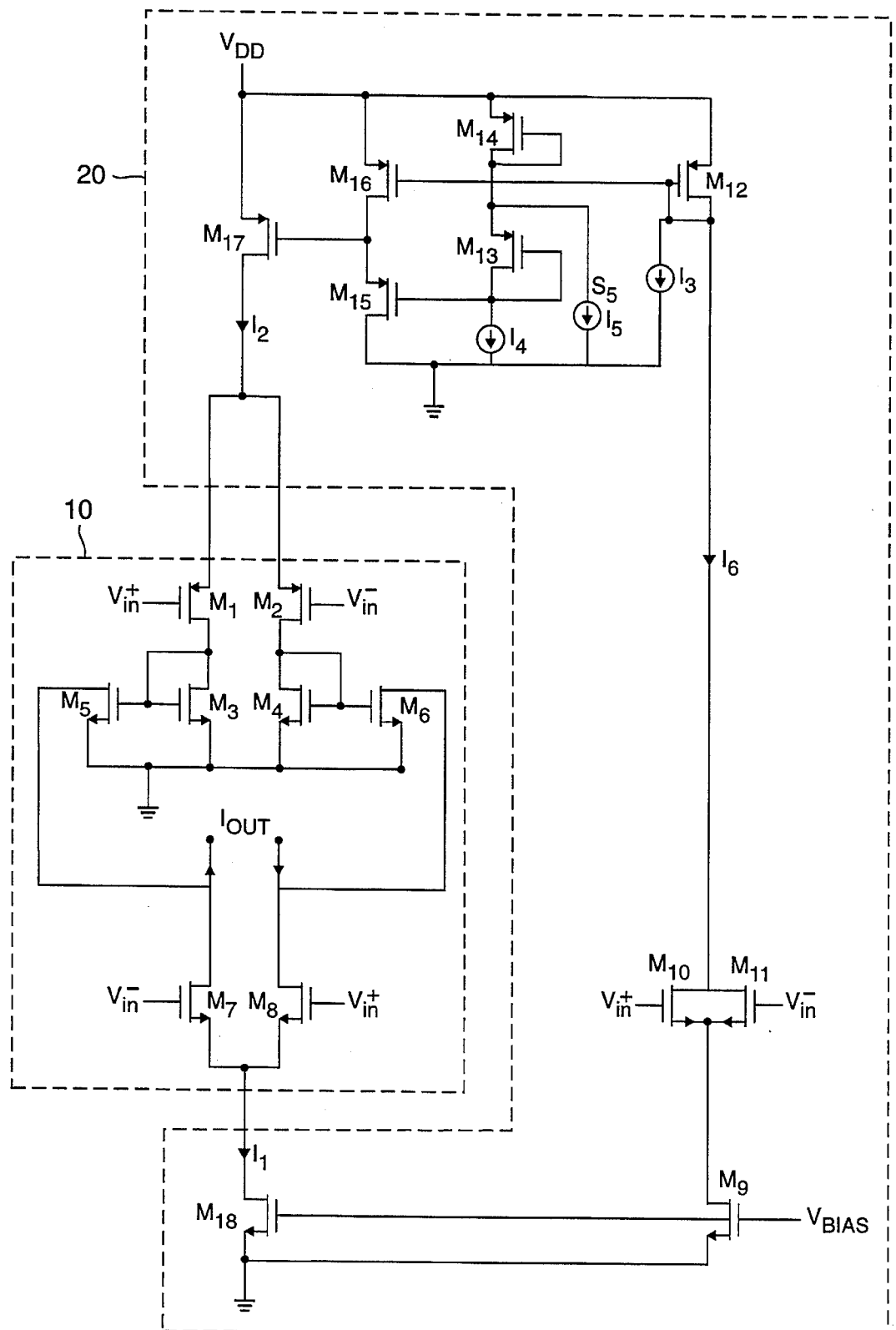
FIG. 3 is a schematic diagram of a constant transconductance amplifier input stage having a rail-to-rail common mode input voltage range.

Referring now to FIG. 3, one embodiment of the present invention is shown schematically and will be described. The components of the amplifier of FIG. 3 may suitably be comprised of components fabricated on a single integrated circuit substrate. The bias circuit 20 provides tail currents $I_1$, $I_2$ to the amplifier 10 instead of the independent constant current sources shown in FIG. 1. Bias circuit 20 is designed to maintain a constant net transconductance in amplifier 10 by manipulating the magnitude of amplifier tail currents $I_1$, $I_2$.

The operation of bias circuit 20 will now be described in greater detail with reference to FIG. 3. It should be noted at the outset that transistors $M_{12}$, $M_{13}$, $M_{14}$, $M_{15}$, $M_{16}$, and $M_{17}$ are assumed to be identical with a conductance constant K and threshold voltage $V_{TP}$. This condition however is not necessary to the proper operation of the bias circuit which would work when these devices are properly scaled versions of each other.

The bias circuit 20 was designed to make the n-channel differential pair $M_7$, $M_8$ of amplifier 10 the "master". That is, the p-channel pair $M_1$, $M_2$ is activated only when the tail current $I_1$ of the n-channel pair $M_7$, $M_8$ starts to drop off. This occurs only at very low values of common mode input voltage. As a result, the p-channel current source $M_{17}$ is guaranteed to be in saturation whenever the p-channel pair $M_1$, $M_2$ is contributing significantly to the net transconductance of the amplifier thereby maintaining a high power supply rejection ration ("PSRR") over the entire common mode input voltage range.

A fixed voltage applied to $V_{BIAS}$ is used to set the value of tail current $I_1$ which will be constant for all but very small values of common mode input voltage. Transistors $M_9$, $M_{10}$, $M_{11}$ provide a reference current 16 in bias circuit 20 which will track variations in tail current $I_1$. Transistor $M_9$ is matched to transistor $M_{18}$ providing a current mirror. As long as transistors $M_9$ and $M_{18}$ are in saturation, transistor $M_9$ ensures that current $I_6$ will be equal to tail current $I_1$. For low values of common mode input voltage, however, transistor $M_{18}$ will be forced out of saturation thus reducing tail current $I_1$. Transistors $M_{10}$ and $M_{11}$, which are matched to transistors $M_7$ and $M_8$, force transistor $M_9$ to follow transistor $M_{18}$ out of saturation for low common mode input voltages. Current $I_6$ therefore will be equal to tail current $I_1$ over the entire common mode input voltage range.

The large signal transfer characteristics for enhancement mode MOSFETs in saturation are approximately given by equation [5] below which relates the transistor gate to source voltage ($V_{gs}$) to the square root of the drain current ($I_D$).

$$V_{gs} = \sqrt{\frac{I_D}{K}} + V_{TP} \quad [5]$$

Using equation [5] the following equations describing the operating points of the transistors of bias circuit 20 are obtained by inspection of FIG. 3. The drain current ($I_D$) of transistor $M_{12}$ is equal to the sum of currents $I_6$ and $I_3$. Substitution into equation [5], thus provides the following equation for transistor $M_{12}$.

$$V_{gs}(M_{12}) = \sqrt{\frac{I_6 + I_3}{K}} + V_{TP} \quad [6]$$

Similarly, the drain current ($I_D$) of transistor $M_{13}$ is equal to current $I_4$. The operating point of transistor $M_{13}$ is, therefore, given by:

$$V_{gs}(M_{13}) = \sqrt{\frac{I_4}{K}} + V_{TP} \quad [7]$$

Noting that the drain current of transistor $M_{14}$ is the sum of currents $I_5$ and $I_4$ and substitution into equation [5] provides:

$$V_{gs}(M_{14}) = \sqrt{\frac{I_5 + I_4}{K}} + V_{TP} \quad [8]$$

The drain current ($I_D$) of transistor $M_{17}$ is equal to tail current $I_2$. Substituting $I_2$ into equation [5] thus yields the operating point of transistor $M_{17}$ as follows:

$$V_{gs}(M_{17}) = \sqrt{\frac{I_2}{K}} + V_{TP} \quad [9]$$

The gate-to-source voltage ($V_{gs}$) of transistor $M_{16}$ is equal to the $V_{gs}$ of transistor $M_{12}$ because their respective gates and sources are connected.

$$V_{gs}(M_{16}) = V_{gs}(M_{12}) \quad [10]$$

Since the drain current ($I_D$) of transistor $M_{15}$ is equal to the drain current of transistor $M_{16}$, the operating point of transistor $M_{15}$ is defined by combining equations [6] and [10] yielding:

$$V_{gs}(M_{15}) = \sqrt{\frac{I_6 + I_3}{K}} + V_{TP} \qquad [11]$$

Further inspection of bias circuit 20 reveals that the sum of the gate-to-source voltages of transistors $M_{17}$ and $M_{15}$ is equal to the sum of the gate-to-source voltages of transistors $M_{13}$ and $M_{14}$. The relationship of those gate-to-source voltages may be rewritten as follows:

$$V_{gs}(M_{17}) = V_{gs}(M_{13}) + V_{gs}(M_{14}) - V_{gs}(M_{15}) \qquad [12]$$

Substituting equations [7], [8], [9], and [11] into equation [12] yields the following equation which defines the relationship of currents in bias circuit 20:

$$\sqrt{\frac{I_2}{K}} + V_{TP} = \sqrt{\frac{I_4}{K}} + V_{TP} + \sqrt{\frac{I_5 + I_4}{K}} + V_{TP} - \left(\sqrt{\frac{I_6 + I_3}{K}} + V_{TP}\right) \qquad [13]$$

Substituting $I_1$ for $I_6$ in equation [13] and simplifying yields:

$$\sqrt{I_2} = \sqrt{I_4} + \sqrt{I_5 + I_4} - \sqrt{I_1 + I_3} \qquad [14]$$

The currents $I_3$, $I_4$ are used only to ensure that transistors $M_{13}$ and $M_{15}$ are biased with at least the minimum amount of current needed to keep them out of weak inversion. The values for currents $I_3$, $I_4$ are thus chosen to be very small (less than 5%) in comparison with $I_5$ and $I_1$. As a result equation [14] is approximated by equation [15], below.

$$\sqrt{I_2} = \sqrt{I_5} - \sqrt{I_1} \qquad [15]$$

Equation [15] may be rewritten as follows:

$$\sqrt{I_1} + \sqrt{I_2} = \sqrt{I_5} \qquad [16]$$

Referring to FIG. 3, independent current source $S_5$ maintains current $I_5$ constant. Substituting equation [16] into equation [2] reveals that this is the required condition for constant net transconductance operation of amplifier 10. By maintaining the sum of the square roots of the tail currents $I_1$, $I_2$ constant, bias circuit 20 substantially eliminates variations in net transconductance of amplifier 10 despite rail-to-rail variations in the common mode input voltage.

Figure 4:
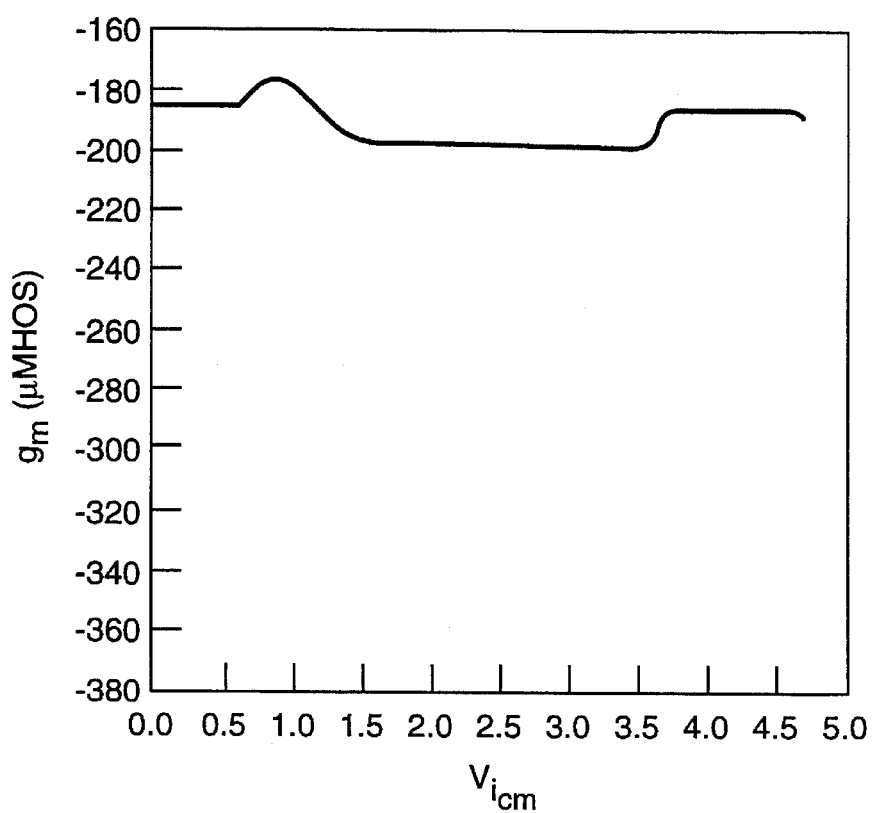
FIG. 4 is a plot of a simulation of the net transconductance versus common mode input voltage for the amplifier input stage of FIG. 3.

A simulation of the net transconductance of amplifier 10 using the bias circuit 20 is plotted in FIG. 4. The nominal tail currents $I_1$, $I_2$ and input transistor $M_1$, $M_2$, $M_7$, $M_8$ sizes are the same as those used for the simulations shown in FIG. 2. Referring to FIG. 4 reveals that the variation in net transconductance for rail-to-rail variations in common mode input voltage is substantially eliminated. The residual deviations from a perfectly flat line are partly due to the non-zero values of $I_3$ and $I_4$ and partly due to the second order factors in the transistor characteristics not included in equations [5] through [9] and [11].

It is clear from FIG. 4 that the net transconductance of the amplifier of FIG. 3 is substantially constant over the entire common mode input voltage range. That represents a substantial improvement over the large variations in net transconductance present in prior art amplifiers plotted in FIG. 2.

From the foregoing description, it will be apparent that improvements in the biasing of amplifiers have been provided to maintain the net transconductance substantially constant despite rail-to-rail variations in common mode input voltage. While a preferred embodiment of the amplifier and bias circuit have been described, it should be appreciated that variations and modifications in the herein described amplifier and bias circuit, within the scope of the invention will be apparent to those skilled in the art. Accordingly, the foregoing description should be taken as illustrative and not in a limiting sense.

I claim:

1. A CMOS differential amplifier having reduced feedback and a substantially constant net transconductance over a large common mode input voltage ranges of operation comprising:

a first differential transistor pair connected at a first tail for receiving a first tail current for biasing and having an input for receiving a differential signal;

a second differential transistor pair connected at a second tail for receiving a second tail current for biasing and having inputs for receiving said differential signal, said second pair being complementary to said first pair;

an output circuit having an input connected to said first pair and to said second pair;

a first current source connected to said first tail for supplying said first tail current;

a reference voltage source connected to said first current source for setting said first tail current to a nominal value;

a first current mirror connected to said first current source and biased to carry a current proportional to that from said first current source, said first current mirror also connected to a dummy differential pair, said dummy differential pair having an input connected to receive said differential signal and an output connected to a first current-to-voltage converter;

said first current mirror providing a representative current indicative of the magnitude of said first tail current;

the first current-to-voltage converter having an input connected to receive said representative current and an output for supplying a first voltage proportional to the square root of the magnitude of said representative current;

a reference current source having an output for supplying a reference current;

a second current-to-voltage converter having a terminal connected to said reference current and supplying a second voltage proportional to the square root of the magnitude of said representative current; and a second current source having an input connected to directly receive a difference voltage representative of the difference between said second voltage and said first voltage and an output connected to said second tail for supplying said second tail current proportional to the square of said difference voltage, thereby manipulating said second tail current in response to variations in said first tail current to maintain a substantially constant net transconductance in said amplifier.

2. The amplifier of claim 1 wherein said second tail current is maintained at a value substantially proportional to the square of the difference between a predetermined constant less the square root of said first tail current.

3. The amplifier of claim 1 wherein:

said first differential transistor pair further comprises n-channel MOSFETs each having a source, a drain, and a gate, said first tail further comprising a junction of said sources of said n-channel MOSFETs; and said second differential transistor pair further comprises p-channel MOSFETs each having a source, a drain, and a gate, said second tail further comprising a junction of said sources of said p-channel MOSFETs.

4. The amplifier of claim 1 wherein said common mode input voltage range includes the supply rails.

5. The amplifier of claim 1 comprising components fabricated on a single integrated circuit substrate.

6. The amplifier of claim 1 comprising matched transistors.

7. The amplifier of claim 1, wherein said difference voltage representative of the difference between said second voltage and said first voltage is provided by a circuit comprising a plurality of identical transistors (M13, M15, M16) connected so that the gate voltage across a first transistor (M15) is substantially the gate voltage of the second current-to-voltage converter, plus the gate voltage of a second transistor (M13), and the gate source drop across said first transistor is substantially the gate source drop of the first current-to-voltage converter, whereby the source voltage of said first transistor is effectively said difference voltage.

* * * * *